(12) United States Patent
Lin et al.

(10) Patent No.: US 9,130,087 B2
(45) Date of Patent: Sep. 8, 2015

(54) LIGHT EMITTING DIODE HAVING CARBON NANOTUBES THEREIN AND METHOD FOR MANUFACTURING THE SAME

(71) Applicant: ADVANCED OPTOELECTRONIC TECHNOLOGY, INC., Hsinchu Hsien (TW)

(72) Inventors: Ya-Wen Lin, Hsinchu (TW); Ching-Hsueh Chiu, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/221,244

(22) Filed: Mar. 20, 2014

(65) Prior Publication Data
US 2015/0048302 A1  Feb. 19, 2015

(30) Foreign Application Priority Data
Aug. 14, 2013  (CN) .......................... 2013 1 0352606

(51) Int. Cl.
| H01L 21/00 | (2006.01) |
| H01L 27/15 | (2006.01) |
| H01L 33/00 | (2010.01) |
| H01L 29/06 | (2006.01) |
| H01L 33/04 | (2010.01) |
| H01L 33/02 | (2010.01) |
| B82Y 30/00 | (2011.01) |

(52) U.S. Cl.
CPC .............. *H01L 33/04* (2013.01); *H01L 33/007* (2013.01); *H01L 33/02* (2013.01); *B82Y 30/00* (2013.01); *Y10S 977/742* (2013.01)

(58) Field of Classification Search
CPC ........ B82Y 20/00; B82Y 10/00; H01L 33/06; H01L 33/0075; H01L 33/0079; H01L 33/32; H01L 33/54; H01L 33/62; H01L 27/15; H01L 21/8252; H01L 2924/01079
USPC ............... 257/79–82, 99, 103, 184, 431, 618; 438/22–27, 29, 37, 45–47
See application file for complete search history.

(56) References Cited

U.S. PATENT DOCUMENTS 8,263,988 B2 *  9/2012  Basceri et al. .................. 257/94

\* cited by examiner

*Primary Examiner* — Hsien Ming Lee
(74) *Attorney, Agent, or Firm* — Novak Druce Connolly Bove + Quigg LLP

(57) ABSTRACT

A light emitting diode includes a substrate, an un-doped GaN layer, a plurality of carbon nanotubes, an N-type GaN layer, an active layer formed on the N-type GaN layer, and a P-type GaN layer formed on the active layer. The substrate includes a first surface and a second surface opposite and parallel to the first surface. A plurality of convexes is formed on the first surface of the substrate. The un-doped GaN layer is formed on the first surface of the substrate. The plurality of carbon nanotubes is formed on an upper surface of the un-doped GaN layer. The plurality of carbon nanotubes is spaced from each other to expose a portion of the upper surface of the un-doped GaN layer. The N-type GaN layer is formed on the exposed portion of the upper surface of the un-doped GaN layer and covering the carbon nanotubes therein.

19 Claims, 8 Drawing Sheets

LIGHT EMITTING DIODE HAVING CARBON NANOTUBES THEREIN AND METHOD FOR MANUFACTURING THE SAME

BACKGROUND

1. Technical Field

This disclosure generally relates to light sources, and particularly to a light emitting diode (LED) having carbon nanotubes therein and a method for manufacturing the light emitting diode.

2. Description of Related Art

A typical light emitting diode includes a sapphire substrate with a flat growing surface, an N-type semiconductor layer formed on the growing surface of the sapphire substrate, an active layer formed on the N-type semiconductor layer, and a P-type semiconductor layer formed on the active layer. Because the growing surface of the sapphire substrate is flat, when the N-type semiconductor grows on the sapphire substrate, a growth defect occurs, resulting in a low quality of the light emitting diode.

What is needed, therefore, is a light emitting diode and a method for manufacturing the light emitting diode which can overcome the forgoing drawback.

DETAILED DESCRIPTION

Figure 1:
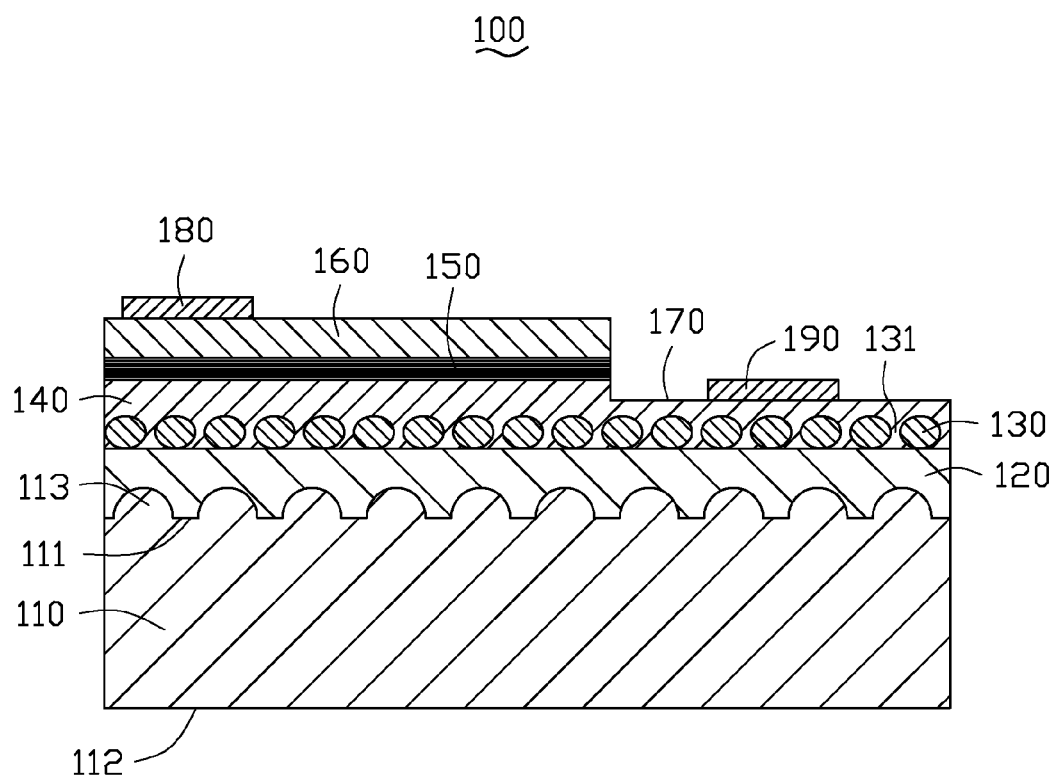
FIG. 1 is a cross-sectional view of a light emitting diode according to an embodiment of the present disclosure.

Referring to FIG. 1, an exemplary light emitting diode 100 of the present disclosure is provided.

The light emitting diode 100 includes a substrate 110, and un-doped GaN layer 120 formed on the substrate 110, a plurality of carbon nanotubes 130 formed on the un-doped GaN layer 120, an N-type GaN layer 140 covering the carbon nanotubes 130, an active layer 150, a P-type GaN layer 160, a P-type electrode 180 sequentially formed on the N-type GaN layer 140, and an N-type electrode 190 formed on the N-type GaN layer 140. In this embodiment, the substrate 110 is made of sapphire.

The substrate 110 includes a first surface 111 and a second surface 112 opposite and parallel to the first surface 111. A plurality of convexes 113 is formed on the first surface 111, so that the first surface 111 has a wave-shaped configuration.

In this embodiment, the convexes 113 are spaced from each other. Each convex 113 has a semicircular-like configuration in cross section. Alternatively, the convex 113 may have a rectangular-like configuration, a trapezoidal-like configuration, a triangular-like configuration, or a polylgonous configuration.

The un-doped GaN layer 120 is formed on the first surface 111 of the substrate 110. In this embodiment, the un-doped GaN layer 120 covers the plurality of convexes 113 therein.

The plurality of carbon nanotubes 130 are formed on an upper surface 121 of the un-doped GaN layer 120 away from the substrate 110. The carbon nanotubes 130 are spaced from each other. A gap 131 is defined between every two adjacent carbon nanotubes 130 to expose a portion of the upper surface 121 of the un-doped GaN layer 120. A diameter of each carbon nanotube 130 is about 20 nm. The carbon nanotubes 130 are crossed on the upper surface 121 of the un-doped GaN layer 120.

The N-type GaN layer 140 grows from the exposed portion of the upper surface 121 of the un-doped GaN layer 120, and extends upwardly along and through the gap 131 between every two carbon nanotubes 130. In this embodiment, the N-type GaN layer 140 fills the gaps 131 entirely, and covers the carbon nanotubes 130 therein.

The active layer 150 and the P-type GaN layer 160 are sequentially formed on the N-type GaN layer 140. The active layer 150 is a multiple quantum wells layer.

According to the exemplary light emitting diode 100 of the present disclosure, because the first surface of the substrate 110 has a plurality of convexes 113 thereon, the un-doped GaN layer 120 grows along the convexes 113 and then laterally, whereby a growth defect of the un-doped GaN layer 120 is decreased. In addition, because a plurality of carbon nanotubes 130 are formed on the upper surface 121 of the un-doped GaN layer 120, the N-type GaN layer 140 grows from the exposed portion of the upper surface 121 of the un-doped GaN layer 120 which is not covered by the carbon nanotubes 130 along and through the gap 131 between every two adjacent carbon nanotubes 130, and then, the N-type GaN layer 140 grows laterally to form the N-type GaN layer 140 to cover the carbon nanotubes 130 therein. Therefore, a growth defect of the N-type GaN layer 140 is decreased, which enables the N-type GaN layer 140 to have a good epitaxial growth quality. And correspondingly, the growth defect of the active layer 150 and the P-type GaN layer 160 is also decreased.

Furthermore, because the electrical resistivity of the carbon nanotubes 130 which is about $10^{-4}\Omega/cm$ is less than the electrical resistivity of the N-type GaN layer 140 which is about $10^{-3}\Omega/cm$, the carbon nanotubes 130 help spread current from the N-type electrode 190 to various regions of the N-type GaN layer 140 to improve the distribution of the current, which increases the light-generating efficiency of the light emitting diode 100.

In this embodiment, a recessed platform 170 is provided. The recessed platform 170 is formed by etching a portion of the N-type GaN layer 140, a portion of the active layer 150 and a portion of the P-type GaN layer 160 to expose a portion of the N-type GaN layer 140. In this embodiment, the N-type electrode 190 is formed on the recessed platform 170 and electrically connected with the N-type GaN layer 140. In addition, a distance between the N-type electrode 190 and the carbon nanotubes 130 therebelow ranges from 0.3 um to 0.5 um, whereby current from the N-type electrode 190 can quickly flow to the carbon nanotubes 130, and then is quickly spread to various regions of the N-type GaN layer 140 via the carbon nanotubes 130.

Figure 2:
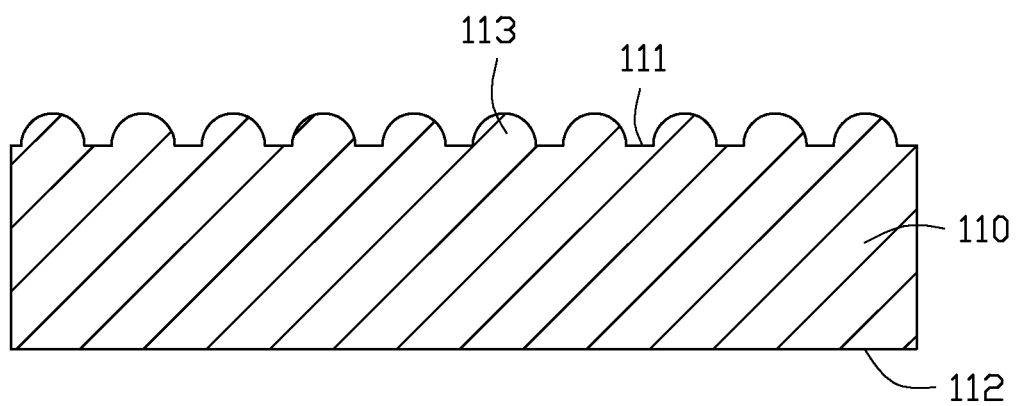
FIGS. 2-8 show the steps of manufacturing the light emitting diode of FIG. 1.

The disclosure also provides a method for manufacturing the light emitting diode 100, and the method includes following steps:

Referring to FIG. 2, a substrate 110 is provided. In this embodiment, the substrate 110 is a sapphire substrate. The substrate 110 includes a first surface 111 and a second surface 112 opposite and parallel to the first surface 111. The substrate 110 includes a plurality of convexes 113 formed on the first surface 111 of the substrate 110.

Figure 3:
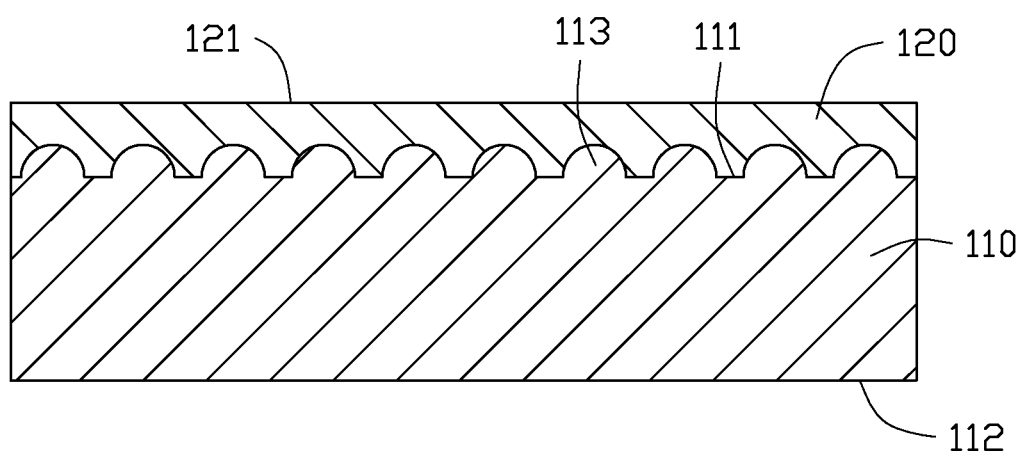

Referring to FIG. 3, an un-doped GaN layer 120 is grown on the first surface 111 of the substrate 110. The un-doped GaN layer 120 grows from the first surface 111 of the substrate 110 and along the convexes 113, then laterally. In this embodiment, the un-doped GaN layer 120 covers the convexes 113 on the first surface 111 of the substrate 110.

Figure 4:
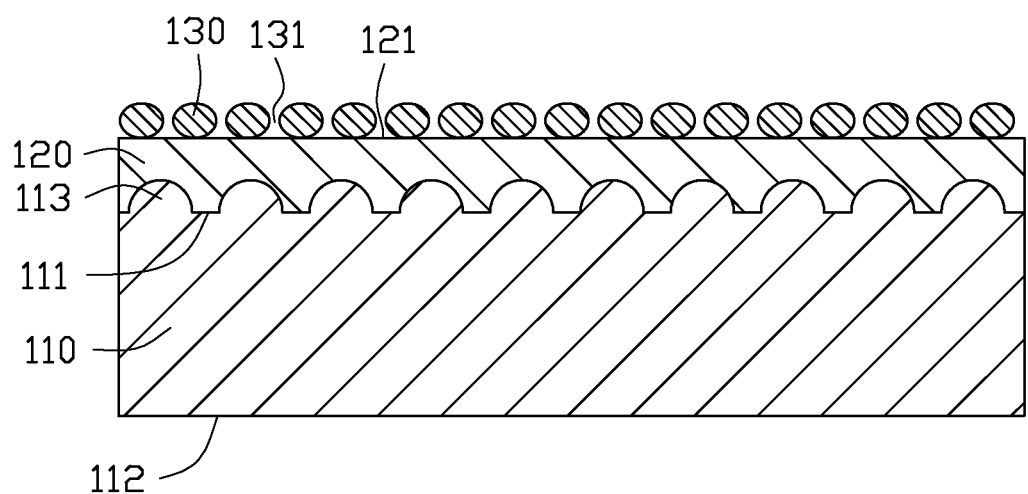

Referring to FIG. 4, a plurality of carbon nanotubes 130 is provided on an upper surface 121 of the un-doped GaN layer 120. The carbon nanotubes 130 are spaced from each other to expose a portion of the upper surface 121 of the un-doped GaN layer 120. The carbon nanotubes 130 are netted.

Figure 5:
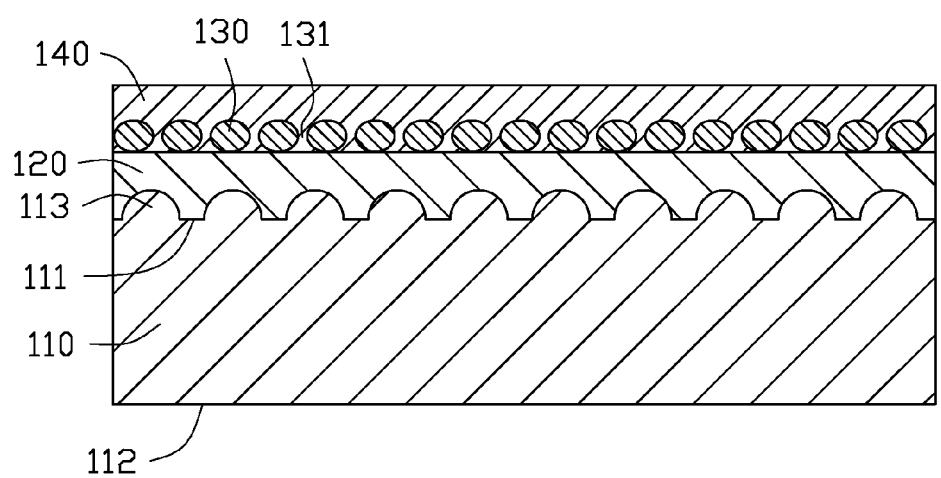

Referring to FIG. 5, an N-type GaN layer 140 is grown from the exposed portion of the upper surface 121 of the un-doped GaN layer 120; the N-type GaN layer 140 grows along and through the gap 131 defined between every two adjacent carbon nanotubes 130 to fill the gaps 131 and then grows laterally to form a single piece covering the carbon nanotubes 130 therein.

Figure 6:
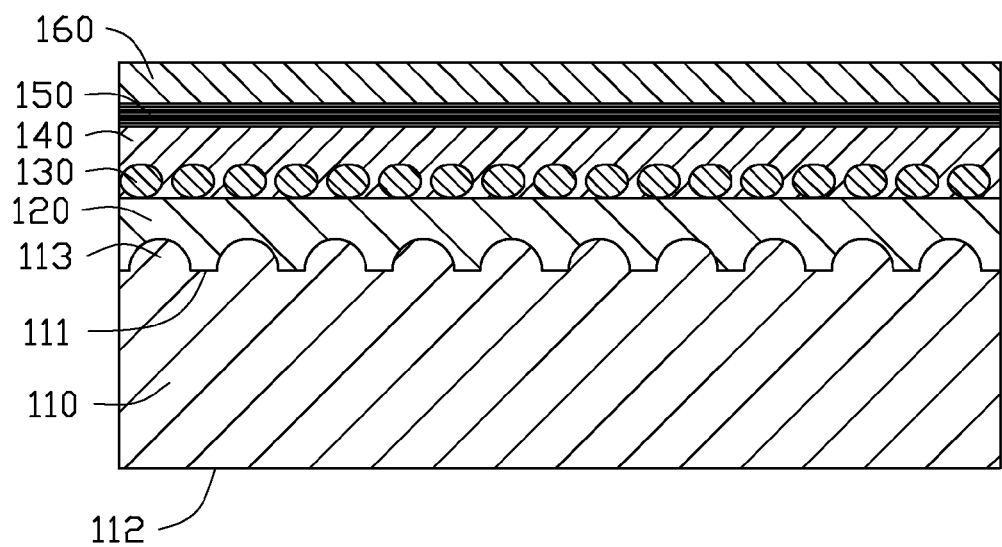
Figure 7:
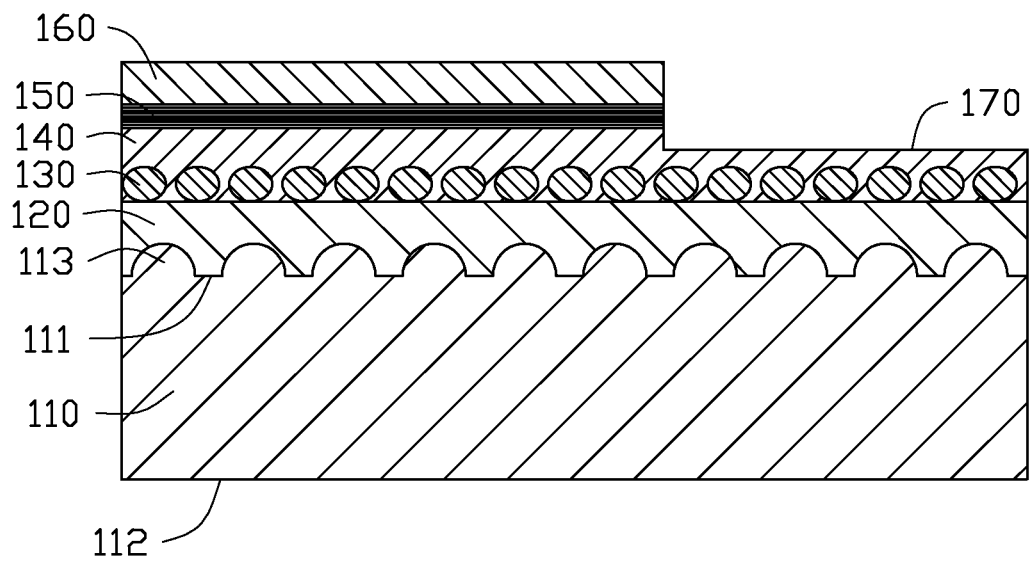

Referring to FIG. 6, an active layer 150 and a P-type GaN layer 160 are sequentially formed on the N-type GaN layer 140. The active layer 150 is a multiple quantum wells layer. In this embodiment, after the P-type GaN layer 160 is formed, a portion of each of the P-type GaN layer 160, the active layer 150 and the N-type GaN layer 140 is etched to expose a portion of the N-type GaN layer 140 (shown in FIG. 7) to thereby form a recessed platform 170 on the exposed portion of the N-type GaN layer 140.

Figure 8:
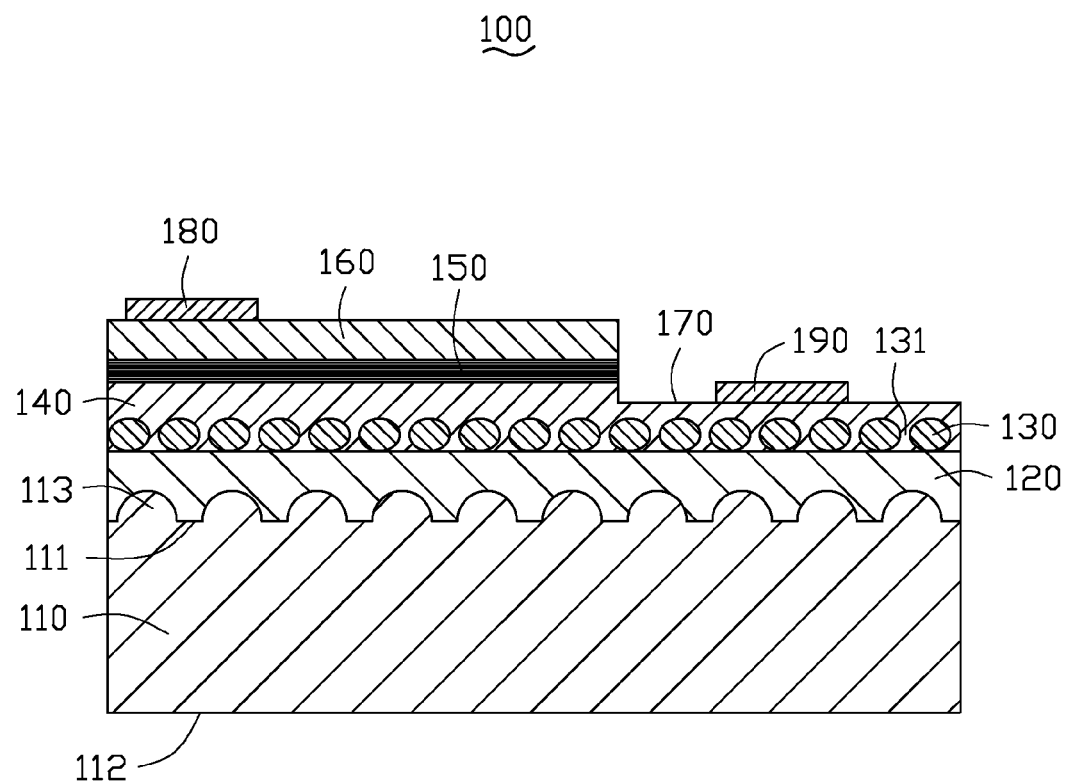

Referring to FIG. 8, a P-type electrode 180 is formed on the P-type GaN layer 160, wherein the P-type electrode 180 electrically connects with the P-type GaN layer 160. The N-type electrode 190 is formed on the recessed platform 170 on the exposed portion of the N-type GaN layer 140 and electrically connects with the N-type GaN layer 140. In this embodiment, a distance between the N-type electrode 190 and the carbon nanotubes 130 therebelow ranges from 0.3 um to 0.5 um.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode, comprising:
    a substrate comprising a first surface and a second surface opposite and parallel to the first surface,
    a plurality of convexes being formed on the first surface of the substrate;
    an un-doped GaN layer formed on the first surface of the substrate;
    a plurality of carbon nanotubes formed on an upper surface of the un-doped GaN layer, the plurality of carbon nanotubes being spaced from each other to expose a portion of the upper surface of the un-doped GaN layer;
    an N-type GaN layer formed on the exposed portion of the upper surface of the un-doped GaN layer and covering the carbon nanotubes therein;
    an active layer formed on the N-type GaN layer; and
    a P-type GaN layer formed on the active layer.

2. The light emitting diode of claim 1, wherein the carbon nanotubes are crossed on the upper surface of the un-doped GaN layer.

3. The light emitting diode of claim 1, wherein the convexes each have a semicircular-like configuration in cross section.

4. The light emitting diode of claim 1, wherein a diameter of each carbon nanotubes is about 20 nm.

5. The light emitting diode of claim 1, wherein the substrate is made of sapphire.

6. The light emitting diode of claim 1, wherein the electrical resistivity of the carbon nanotubes is less than the electrical resistivity of the N-type GaN layer.

7. The light emitting diode of claim 6, wherein an N-type electrode is electrically connected to the N-type GaN layer and a distance between the N-type electrode and the carbon nanotubes therebelow ranges from 0.3 um to 0.5 um.

8. The light emitting diode of claim 1, wherein the active layer is a multiple quantum wells layer.

9. The light emitting diode of claim 1, wherein the plurality of convexes are spaced from each other.

10. The light emitting diode of claim 1, wherein the N-type GaN layer entirely fills in gaps defined between every two adjacent carbon nanotubes.

11. A method for manufacturing a light emitting diode, comprising:
    providing a substrate comprising a first surface and a second surface parallel and opposite to the first surface, a plurality of convexes being formed on the first surface of the substrate;
    growing an un-doped GaN layer on the first surface of the substrate;
    forming a plurality of carbon nanotubes on an upper surface of the un-doped GaN layer away from the substrate, the carbon nanotubes being spaced from each other to expose a portion of the upper surface of the un-doped GaN layer;
    growing an N-type GaN layer from the exposed portion of the upper surface of the un-doped GaN layer to cover the carbon nanotubes therein;
    growing an active layer on the N-type GaN layer; and
    growing a P-type GaN layer on the active layer.

12. The method of claim 11, wherein the carbon nanotubes are crossed on the upper surface of the un-doped GaN layer.

13. The method of claim 11, wherein further comprising etching a portion of P-type GaN layer, a portion of active layer and a portion of the N-type GaN layer to expose the N-type GaN layer, and forming a P-type electrode on the P-type GaN layer and forming an N-type electrode on the exposed portion of the N-type GaN layer.

14. The method of claim 13, wherein a distance between the N-type electrode and the carbon nanotubes therebelow ranges from 0.3 um to 0.5 um.

15. The method of claim 11, wherein the convexes are spaced from each other.

16. The method of claim 11, wherein the convexes each have a semicircular-like configuration in cross section.

17. The method of claim 11, wherein a diameter of each carbon nanotube is about 20 nm.

18. The method of claim 11, wherein the electrical resistivity of the carbon nanotubes is less than the electrical resistivity of the N-type GaN layer.

19. The method of claim 11, wherein the substrate is made of sapphire.

* * * * *